US006714027B1

(12) United States Patent
Lui et al.

(10) Patent No.: US 6,714,027 B1
(45) Date of Patent: Mar. 30, 2004

(54) METHOD AND APPARATUS FOR CALCULATING THE ELECTRICAL CHARACTERISTICS OF MATERIALS OF THIN FILM TRANSISTORS

(75) Inventors: Basil Lui, Cambridge (GB); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 106 days.

(21) Appl. No.: 09/762,591
(22) PCT Filed: Jun. 15, 2000
(86) PCT No.: PCT/GB00/02325
  § 371 (c)(1),
  (2), (4) Date: Mar. 30, 2001
(87) PCT Pub. No.: WO00/77834
  PCT Pub. Date: Dec. 21, 2000

(30) Foreign Application Priority Data

Jun. 15, 1999  (GB) .............................. 9913916

(51) Int. Cl.$^7$ .................. G01R 31/26; G01N 27/60; G06F 17/50
(52) U.S. Cl. ................ 324/719; 324/452; 703/14; 716/4
(58) Field of Search ................ 324/719, 717, 324/722, 158.1, 452, 456, 457; 257/57; 703/14, 15; 716/4, 5

(56) References Cited

U.S. PATENT DOCUMENTS 5,396,169 A  *  3/1995  Buehler et al. .......... 324/158.1
5,761,082 A  *  6/1998  Miura-Mattausch ......... 703/14

2002/0123872 A1 *  9/2002  Okada ................... 703/15

OTHER PUBLICATIONS

O. K. B. Lui et al. " A Polysilicon TFT Parameter Extractor," Material Research Symposium Proceedings, vol. 507, 1998, pp 365–370.*

(List continued on next page.)

*Primary Examiner*—Anjan K. Deb
(74) *Attorney, Agent, or Firm*—Oliff & Berridge, PLC

(57) ABSTRACT

A device and automated method of calculating bulk states information and interface states information of a thin film transistor from a current-voltage measurement and a capacitance-voltage measurement comprising the steps of: calculating the flat band voltage from the input capacitance-voltage measurement; applying a general expression of Gauss's Law and the calculated flat band voltage to a capacitance voltage relationship which define capacitance so as to calculate a relationship between gate surface potential and gate/source voltage; applying Gauss's Law to the calculated relationship between gate surface potential and gate/source voltage to thereby calculate and ouput the interface states; calculating conductance/gate voltage data from the current-voltage measurement using the calculated flat band voltage; conducting an initialisation process using the calculated conductance/gate voltage data and the calculated relationship between gate surface potential and gate/source voltage, said initialisation process using a conductance equation so as to calculate initialised values for the electron conductance at the flat band voltage, for the hole conductance at the flat band voltage, for a density of states function and for the Fermi Energy; conducting an iteration process based on Poisson's equation using the said initialised values calculated by the initialisation process and the calculated conductance/gate voltage data to thereby calculate and output the bulk states information.

2 Claims, 8 Drawing Sheets

OTHER PUBLICATIONS

S. W. B. Tam et al. "Observations of a 'Capacitance Overshoot' in the Transient Current Measurement of Polysilican TFTs" IEEE Transactions on Electron Devices, vol. 46, Jan. 1999, pp 134–138.*

S. W. B. Tam "The Intra–Nodal Capacitances of Polycrystalline Silicon Thon Film Transistors: Measurement and Modelling" Cambridge University, Ph.D. Thesis, Oct. 1994, pp 1–13.*

S.K.H. Fung et al. "Impact of Scaling Silicon Film Thickness and Channel Width an SOI MOSFET with Reoxidized MESA Isolation" IEEE Transactions on Electron Devices, vol. 45, No. 5, May 1998, pp1105–1110.*

Lee Kyung–ha " A Study of Laser Anneled Polycrystaline Silicon Thin Film Transistors (TFTs) with SiNx Gate Insulator" Kyung Hee Univ., 1998, Chapter 6.*

J. P. Bender et al. "Alternating Current $Thin_{13}$ Film Electroluminescent Device Modeling via SPICE Fowler–Nordheim Diode" IEEE Transactions on Electron Devices vol. 47, No. 5, May 2000, pp 1113–1115.*

"TFT Technology" Silvaco International Brochure, Dec. 2001, pp 1–4.*

"A Polysilicon TFT Parameter Extractor" by O.K.B. Lui et al., Mat. Res. Soc. Symp. Proc., vol. 507., United Kingdom, 1998.

* cited by examiner

Fig. 13

$$Q_G = \int_0^L\int_0^W C_{ax} V_{ax}\, dz\, dy = C_{ax} W \int_0^L (V_{GS} - \Psi_S(y, V_{GS}(0,t))\, dy, \quad (1)$$

$$\frac{d\Psi_S}{dV_{GS}} = 1 - \frac{C}{C_{ax}WL}, \quad (2)$$

$$Q_G = Q_{SS} + Q_B = C_{ax}WL(V_{GS} - \Psi_S), \text{ where } Q_B = \varepsilon_S F_S \text{ and } F_S = -\frac{d\Psi}{dx}\bigg|_{x=0}, \quad (3)$$

$$\frac{d^2\Psi}{dx^2} = \frac{q}{\varepsilon}\left[ N_{E_1}\int_{E_v}^{E_1}[f(\Psi)-f_0]dE + N_{E_2}\int_{E_1}^{E_2}[f(\Psi)-f_0]dE + \ldots + N_{E_j}\int_{E_{j-1}}^{E_c}[f(\Psi)-f_0]dE \right] + \frac{q}{\varepsilon}(n(\Psi)-n_0), \quad (4)$$

$$G = \frac{G_{n0}}{d}\int_0^d e^{\frac{q\Psi(x)}{kT}}dx + \frac{G_{p0}}{d}\int_0^d e^{\frac{-q\Psi(x)}{kT}}dx, \quad (5)$$

$$\Psi(x) = \frac{\Psi_2}{2}\left[(1+\sqrt{1-C_1^2})e^{\frac{x}{L_D}} + \frac{C_1^2}{1+\sqrt{1-C_1^2}}e^{\frac{x}{L_D}}\right] \quad (6)$$

where $$C_1 = \frac{2}{\frac{d}{e^{L_D}}+e^{\frac{d}{L_D}}} \quad \text{and } 0 < C_1 < 1. \quad L_D^2 = \frac{\varepsilon_3}{q^2 N_E}$$

and

METHOD AND APPARATUS FOR CALCULATING THE ELECTRICAL CHARACTERISTICS OF MATERIALS OF THIN FILM TRANSISTORS

The present invention relates to a method of calculating the electrical characteristics of materials of thin film transistors (TFTs).

Having regard to the complexity and cost of the fabrication processes for manufacturing thin film transistors, it is highly desirable if not essential for the design and performance evaluation of such transistors to be undertaken using mathmatical simulations, often referred to as modelling. Crucial to such modelling is the acurate calculation of the electrical characteristics of materials of thin film transistors. Consequently, considerable effort has previously been spent in developing methods of calculating such characteristics. Such methods are usually embodied in computer programs which are often sold as staple commercial products by or on behalf their developers to designers and manufacturers of thin film transistors and other semiconductor products including such transistors.

Known methods of calculating the electrical characteristics of materials of thin film transistors suffer various disadvantages, common amongst which are relatively slow execution speeds (often of the order of one to two weeks) and often significant deviations of the calculated results from the real characteristics. Some known methods require the destructive testing of the sample. It is an object of the present invention to mitigate these and other disadvantages.

Thin film transistors are most often fabricated from polysilicon and this, as with alternative materials, consists of crystalline regions (grains), typically between a hundred to a few thousand angstroms in size, separated by grain boundaries. A high density of dangling bonds are present at these grain boundaries. These dangling bonds give rise to states all over the energy gap, due to their variable electronic energy levels. In addition, other gap states can be introduced as a Consequence of random fluctuations of the crystalline potential. These disorder-induced localised states are located in energy near the conduction and valence bands, and constitute the so-called tail states. In polysilicon, these states are probably associated with non-uniform strain fields, and may be distributed over the grain volume. As the density-of-states (DOS) is spatially non-uniform, the physical modelling of polysilicon is complex.

FIG. 1 shows two typical transfer curves of an n-channel polysilicon TFT, the typical structure of which is shown in FIG. 2. The first case is when the drain to source voltage $V_{DS}$ is low (0.1v), and the second case when $V_{DS}$ is high (5,1v). For both cases, when the gate voltage $V_{GS}$ is small but positive, the current $I_{DS}$ which flows between the source and drain, due to $V_{DS}$, is very small. This is due to the high resistance of the undoped active layer. As $V_{GS}$ is increased, charge is induced near the oxide-semiconductor interface and a conductive path known as the channel is formed between the source and the drain, hence resulting in an increase of $I_{DS}$ by several orders of magnitude. However, the electrical characteristics of these devices have a much lower apparent mobility and a higher apparent threshold voltage than their single crystal counterparts. This is due to the presence of a continuum of states in the energy gap (the DOS).

Several computer programs using a reverse modelling technique have been commercially available for a number of years. Various design and research groups have used these programs while adopting a distributed defect approximation. The approximation enables spatially localised DOS of polysilicon TFTs to be described assuming an effective DOS uniform over the grain volume. This is also known as the effective medium approach, whereby the effective DOS is considered to be uniformly distributed throughout the polyisilicon active layer thickness. These known methods are time consuming, taking anything from several hours to several weeks of computing time, and suffer uncertainties due to unknown parameters such as the flat band voltage and the Fermi energy.

The so-called field-effect method has become quite popular due to it's apparent simplicity. It suffers the disadvantages of the effective medium approach and can present serious shortcomings such as assuming a semi-infinite active layer thickness and no interface states. It suffers from various sources of inaccuracy. In particular, the flat band voltage ($V_{FB}$), the bulk Fermi energy ($E_F$) and the electron and hole contributions ($G_{n0}$, $G_{p0}$) to the conductance ($G_O$) at the flat band voltage are not known. This may result in incorrect location of the DOS function along the energy axis. The 0° Kelvin approximation for the Fermi function must be assumed, which results in an overestimation of the DOS. Further, the use of the second derivative of the square of the surface field ($F_S$) magnifies noise resulting in inaccuracies especially near mid gap, where oscillations larger than one order of magnitude are observed.

Another known method, the Temperature Method, relies upon the input data being functions of temperature. This method enables estimates to be made of the flat band voltage, the Fermi energy, the electron conductance ($G_{n0}$) and the hole conductance ($G_{p0}$). However, both the initial data capture and the analysis procedure are relatively complex. In particular, to obtain the input data requires the sample to be mounted in a cryostat. Uncertainties exist due to the temperature dependence of the Fermi function and the 0° Kelvin approximation and second derivative of the square of the surface field ($F_S$) still exist.

With the increasing use of thinner active layers (<100 nm) the effect of the interface states is becoming more significant. Thus, it has been proposed to attempt to determine both the interface and bulk DOS; but such proposals have not dealt with the problems of determining the flat band voltage and the Fermi energy, neither have they avoided the uncertainties of the 0° Kelvin approximation and second derivative of the square of the surface field ($F_S$).

Against this background the present invention provides, in a first aspect, an automated method a method of determining the bulk states and interface states of a polysilicon thin film transistor from a current-voltage measurement and a capacitance-voltage measurement, the current-voltage measurement being source/drain current ($I_{DS}$) measurements relative to gate/source voltage ($V_{GS}$): comprising the steps of:

a determining the minima of the capacitance-voltage measurement and assigning this value as the flat band voltage ($V_{FB}$)

b using the flat band voltage ($V_{FB}$) and the capacitance-voltage measurement to calculate the relationship between the gate surface potential ($\psi_s$) and gate/source voltage ($V_{GS}$), using the relationship that the charge on the gate ($Q_G$) is equal to the integral of the product of the oxide capacitance per unit area ($C_{ox}$) and the voltage drop across the oxide ($V_{ox}$) and the relationship that the derivative of the gate surface potential ($\psi_s$) with respect to the gate/source voltage ($V_{GS}$) is a function of the gate width (W), channel length (L), the capacitance (C) measured between the gate and the drain/source contacts electrically connected together;

c using the calculated relationship between the gate surface potential ($\psi_s$) and gate/source voltage ($V_{GS}$), the relationship that the charge on the gate ($Q_G$) is equal to the integral of the product of the oxide capacitance per unit area ($C_{ox}$) and the voltage drop across the oxide ($V_{ox}$), the relationship that the charge on the gate ($Q_G$) is the sum of the surface charge ($Q_{ss}$) and the bulk charge ($Q_B$) where the the bulk charge ($Q_B$) is the product of the dielectric permittivity of silicon ($\epsilon_S$) and the surface field ($F_S$), which is the derivative of the calculated profile of the surface potential ($\psi_x$); to calculate and output the interface states information;

d dividing the source/drain current ($I_{DS}$) with the drain/source voltage ($V_{DS}$) to obtain conductance/gate voltage data (G-$V_{GS}$);

e using the conductance/gate voltage data (G-$V_{GS}$) and the flat band voltage ($V_{FB}$) to provide inputs to an initialisation process and to an iteration process, the initialisation process also receiving as an input the calculated relationship between the gate surface potential ($\psi_s$) and gate/source voltage ($V_{GS}$);

f the initialisation process comprising the steps of:
1 calculating the conductance (G{$V_{FB}$}) at the flat band voltage ($V_{FB}$) from the conductance/gate voltage data (G-$V_{GS}$);
2 initialising a calculation of the profile of the surface potential ($\psi_x$) using Poisson's equation, in which the Fermi function (f) is used and in which the density of states ($N_E$) is separated into a plurality of discrete blocks, using the calculated conductance (G{$V_{FB}$}) at the flat band voltage ($V_{FB}$) and using the calculated relationship between the gate surface potential ($\psi_s$) and gate/source voltage ($V_{GS}$) in a function for the profile of the surface potential ($\psi_x$) based on the variables of the gate surface potential ($\psi_s$), the density of states ($N_E$), and the active layer thickness (d);
3 applying a least squares method to the initialises calculation of the profile of the surface potential ($\psi_x$) so as to calculate intialised values for :the electron conductance ($G_{n0}$) at the flat band voltage, the hole conductance ($G_{p0}$) at the flat band voltage, the density of states ($N_E$), and the Fermi energy ($E_F$);

g the iteration process comprising the steps of:
1 using the calculated conductance/gate voltage data (G-$V_{GS}$) and the initalised values of the electron conductance ($G_{n0}$) at the flat band voltage and the hole conductance ($G_{p0}$) at the flat band voltage in making a comparison of experimental conductance with conductance calculated as the sum of a function of the electron conductance ($G_{n0}$) at the flat band voltage and a function of the hole conductance ($G_{p0}$) at the flat band voltage;
2 using the result of the comparision to calculate the electron conductance ($G_{n0}$), the hole conductance ($G_{p0}$), the density of states at the flat band voltage ($N_E$), and Fermi energy ($E_F$);
3 using the result of the comparision to adjust the profile of the surface potential ($\psi_x$);
4 using the adjusted profile of the surface potential ($\psi_x$) and the initialised values of the density of states at the flat band voltage ($N_E$), and Fermi energy ($E_F$) to calculate the profile of the surface potential ($\psi_x$) using Poisson's equation, in which the Fermi function (f) is used and in which the density of states ($N_E$) is separated into a plurality of discrete blocks;
5 adopting a relaxation by applying the boundary conditions $\psi(0)=\psi_s$ and $d\psi/dx|_{x=d}=0$, where d is the active layer thickness to calculate a value for the profile of the surface potential ($\psi_x$);
6 repeating steps 1 to 5 inclusive of the iteration process a plurality of times;

h whereby the result of the iteration process is an output of the bulk states information.

The present invention provides, in a second aspect, a device for modelling electrical characteristics of a thin film transistor comprising:

means for receiving the result of a current-voltage measurement and a capacitance-voltage measurement both measurements having been performed on the thin film transistor;

means which calculate the flat band voltage from the input capacitance-voltage measurement;

means having stored therein a general expression of Gauss's Law;

means having stored therein a capacitance voltage relationship which defines capacitance;

means which apply the general expression of Gauss's Law and the calculated flat band voltage to the capacitance voltage relationship which defines capacitance so as to calculate a relationship between gate surface potential and gate/source voltage;

means which apply Gauss's Law to the calculated relationship between gate surface potential and gate/source voltage to thereby calculate and output interface states information for the thin film transistor;

means which calculate conductance/gate voltage data from the current-voltage measurement using the calculated flat band voltage;

means having stored therein a conductance equation;

initialisation means which conduct an initialisation process using the calculated conductance/gate voltage data and the calculated relationship between gate surface potential and gate/source voltage, and which uses the conductance equation so as to calculate initalised values for the electron conductance at the flat band voltage, for the hole conductance at the flat band voltage, for a density of states function and for the Fermi Energy;

means having stored therein Poisson's equation;

iteration means which conduct an iteration process based on Poisson's equation using the said initalised values calculated by the initialisation means and the calculated conductance/gate voltage data to thereby calculate and output bulk states information for the thin film transistor;

wherein the initialisation means comprises:
means which calculate the conductance at the flat band voltage from the conductance/gate voltage data;
means having stored therein an expression of Poisson's equation, which expression uses the Fermi function and in which the density of states is separated into a plurality of discrete blocks;
means having stored therein a function for the profile of the surface potential based on the variables of the gate surface potential, the density of states, the distance into the active layer and the active layer thickness;
means which initialise a calculation of the profile of the surface potential, said calculation using the said expression of Poisson's equation, using the calculated conductance at the flat band voltage and using the calculated relationship between the gate surface potential and gate/source voltage in the said function for the profile of the surface potential;

means which apply a least squares method to the initialised calculation of the profile of the surface potential so as to calculate intialised values for the electron conductance at the flat band voltage, the hole conductance at the flat band voltage, the density of states, and the Fermi energy; and wherein the iteration means comprises:

means which use the calculated conductance/gate voltage data and the initalised values of the electron conductance at the flat band voltage and the hole conductance at the flat band voltage in making a comparison of experimental conductance with conductance calculated as the sum of a function of the electron conductance at the flat band voltage and a function of the hole conductance at the flat band voltage;

means which use the result of the comparision to calculate the electron conductance, the hole conductance, the density of states at the flat band voltage, and Fermi energy;

means which use the result of the comparision to adjust the profile of the surface potential;

means which use the adjusted profile of the surface potential and the initialised values of the density of states at the flat band voltage, and Fermi energy to calculate the profile of the surface potential using Poisson's equation, in which the Fermi function is used and in which the density of states is separated into a plurality of discrete blocks;

means which adopt a relaxation by applying boundary conditions for the surface potential and the first derivative thereof to calculate a value for the profile of the surface potential;

means which apply the calculated value for the profile of the surface potential to the said comparison of conductances so as to repeat the iteration process.

The present invention thus provides a method and device for the accurate determination of interface and bulk density of states in TFTs, based on an analysis of the I-V and C-V characteristics. The invention can eliminate sources of inaccuracies that are known to be present in conventional methods. In contrast to the known art, the invention enables the determination of the flat band voltage, ($V_{FB}$), the electron and hole flat band conductances ($G_{n0}$, $G_{p0}$), and hence the bulk Fermi energy, ($E_F$). Knowledge of these parameters is not only essential for accurate determination of bulk and interface DOS, but is important in its own right as a process characterisation tool. The method of the present invention extracts the DOS function ($N_E$) directly from Poisson's equation.

The advantages of the invention include: greater immunity to noise from the original data; use of the complete Fermi function (no 0° Kelvin approximation); applicability to thin active layers. The level of accuracy achieved in the DOS determination is much higher than with the previously known methods. Additionally, along with the bulk DOS, the method determines the interface state density. This information is very important both for device design and process characterisation. Finally the extraction is very fast. The method of the present invention implemented using a conventional Pentium PC can require as little as 10 minutes to produce a DOS spectrum of 15 points.

Embodiments of the invention will now be described in more detail and by way of further example only and with reference to the accompanying drawings, in which:

FIG. 13 is a list of equations used in a processing method according to one embodiment of the present invention.

Figure 4:
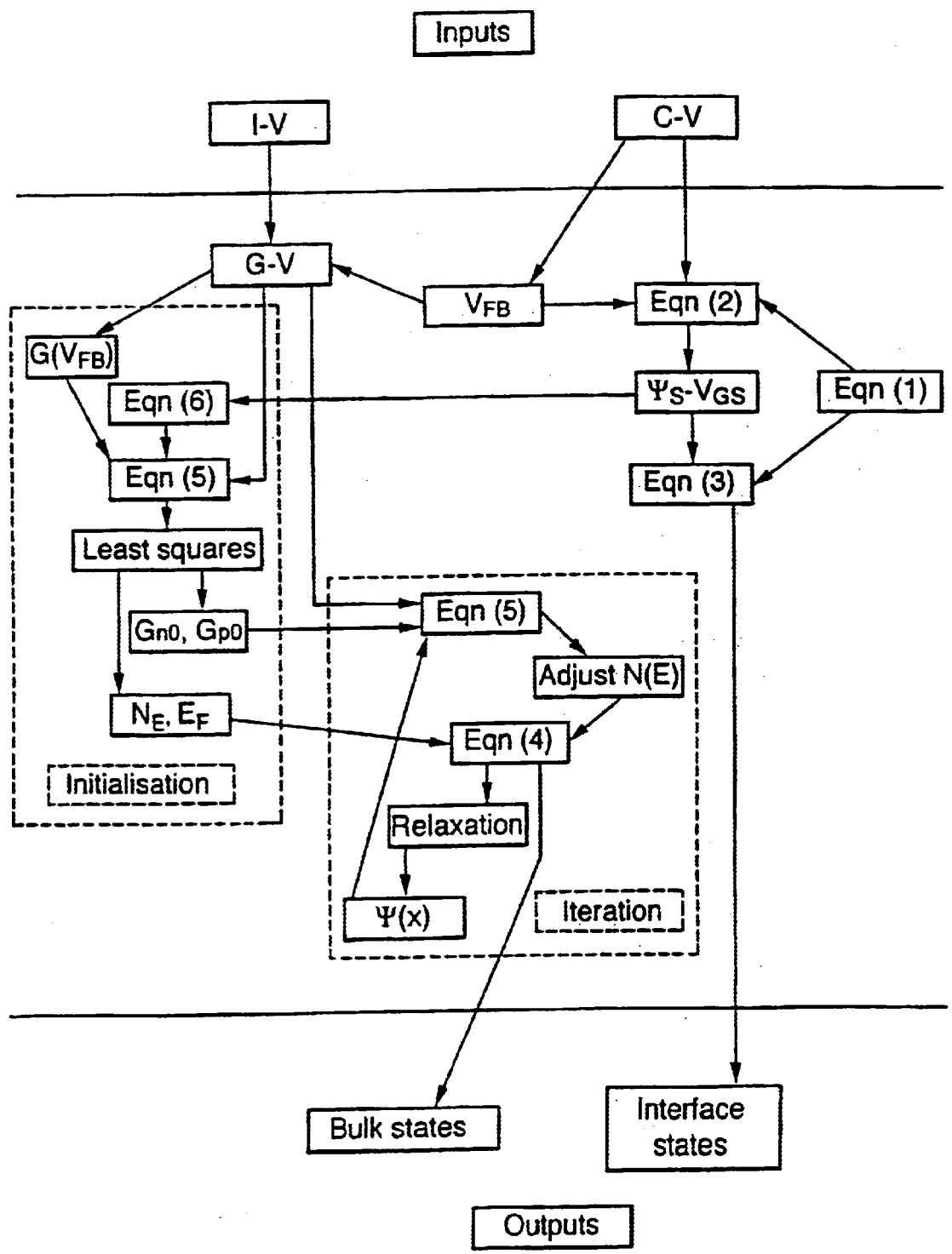
FIG. 4 is a flowchart illustrating the process steps of an embodiment of a method according to the present invention.

A method according to the present invention enables calculation of both the bulk states and the interface states of materials used in TFTs from two simple I-V and C-V measurements made at room temperature. A flow chart of such a method is shown in FIG. 4. The two inputs are shown above the upper horizontal line and the two outputs are shown below the lower horizontal line. The automated processing steps are shown between the two horizontal lines and the references Eqn(1) etc refer to the respective equations listed in FIG. 13. As will be appreciated from FIG. 4, the interface states are determined from the C-V data and the bulk states are determined in accordance with an initialisation stage followed by an iteration stage. Determination of the bulk states is largely dependent upon the I-V input data, but certain inputs derived from the C-V input data are also required.

Figure 1:
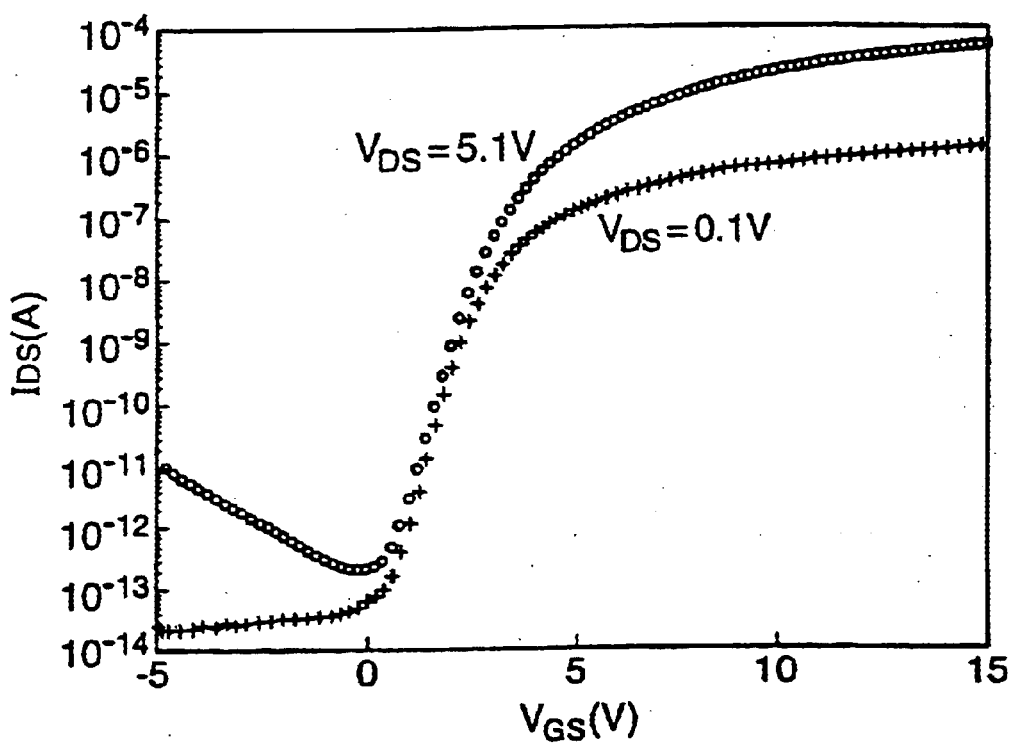
FIG. 1 is a graph showing transfer characteristic plots of $I_{DS}$ against $V_{DS}$ for an n-channel polysilicon TFT.
Figure 2:
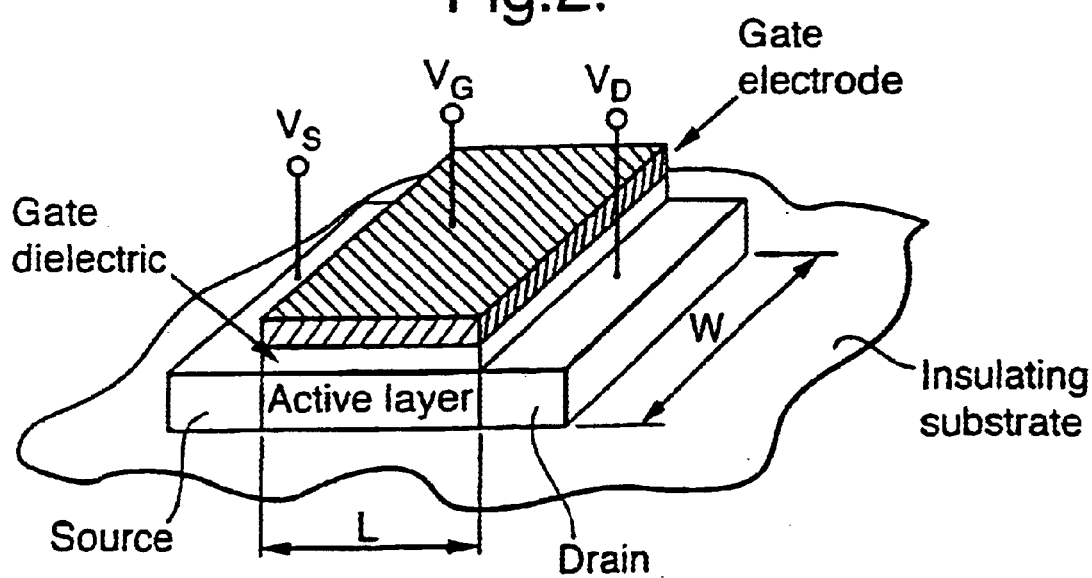
FIG. 2 illustrates the structure of a typical TFT.
Figure 3:
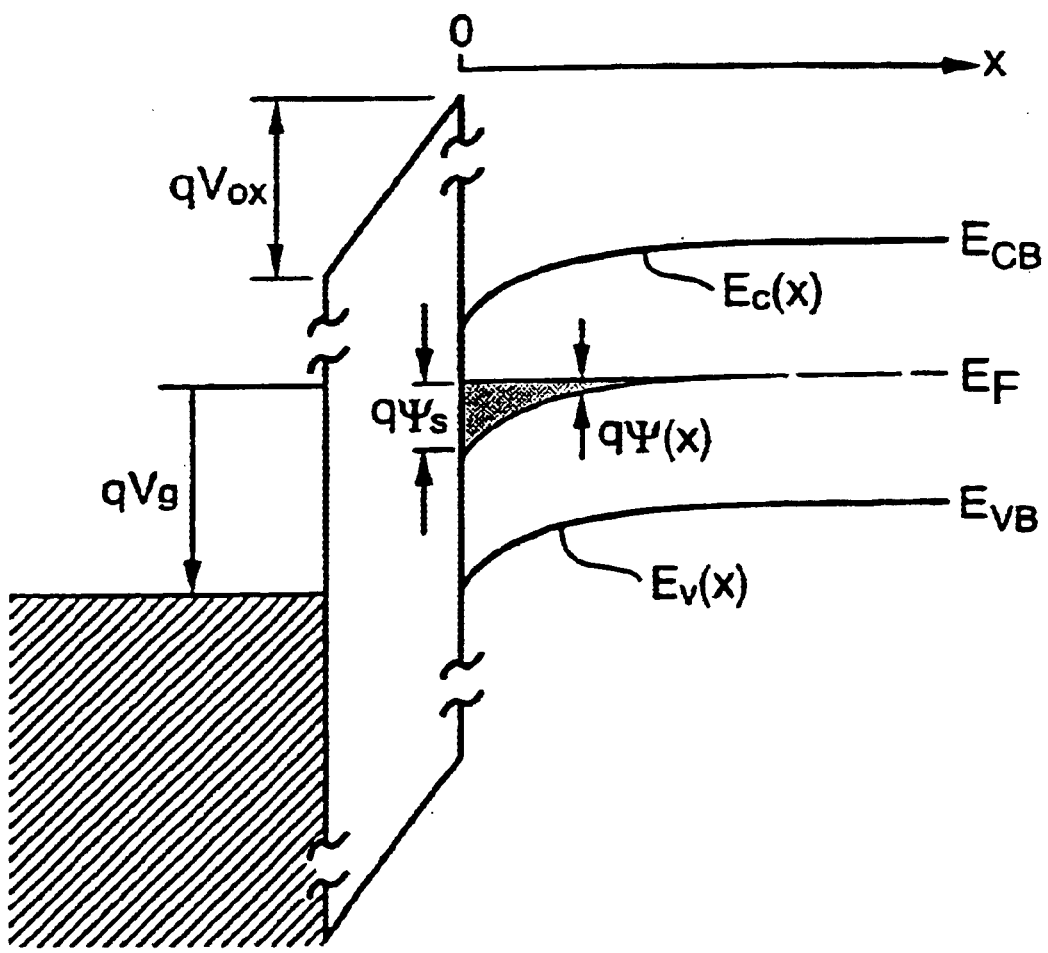
FIG. 3 is an energy band diagram of an n-channel TFT in the direction orthogonal to the channel.

FIG. 2 illustrates the structure of a typical polysilicon TFT and indicates the structural dimensions referred to hereinafter. FIG. 3 is the energy band diagram of the TFT shown in FIG. 2, in the direction orthogonal to the channel. FIG. 3 illustrates the bending of the energy bands.

The method according to the present invention makes use of a general expression of Gauss's Law. Such a general expression of Gauss's Law is shown as Eqn.(1) in FIG. 13. In Eqn.(1) $Q_G$ is the charge on the metal gate, $C_{ox}$ is the oxide capacitance per unit area, $V_{ox}$ is the voltage drop across the oxide, W is the gate width and y is the co-ordinate parallel to the channel. The surface potential, $\psi_s$, is dependent upon the time trough the gate voltage, ie $V_{GS}(t)$, and is also explicitly due to the floating body. That is it takes a finite time after the application of $V_{GS}$ for $\psi_s$ to reach a steady state value.

Assuming a low enough excitation frequency at the gate, shorting the drain and source so that $V_{DS}=0$ and Ψs is uniform over the channel length L, we can obtain Eqn.(2) from Eqn.(1), where C is the measured capacitance between the gate and the combined drain and source contacts tied together. From this we obtain the Ψs-$V_{GS}$ relationship, once the flat band voltage, $V_{FB}$, is known.

Under the assumption that both the bulk DOS N(E) and interface state density $N_{ss}$ can be considered constant near flat band, $V_{FB}$ is given by the minimum in the low frequency C-V curve. This is an important starting point in this embodiment of the invention.

The $V_{GS}$-Ψs relationship obtained from the low frequency C-V data is independent of the conductance-gate voltage (G–$V_{GS}$) data—which is obtained from the $I_{DS}$-$V_{GS}$ data simply by dividing $I_{DS}$ with a the low $V_{DS}$ value used in the I-V measurement. The G-$V_{GS}$ data will provide the additional relationship necessary to separate the interface states from the bulk DOS.

Eqn.(1) can be re-written as Eqn.(3) where $Q_{ss}$ is the surface charge, $Q_B$ is the bulk charge and $\epsilon_s$ is the dielectric permittivity of silicon. Since the $V_{GS}$–Ψs relationship obtained from the low frequency C-V data is known, the surface charge can be obtained once the bulk charge is known. In order to obtain the latter, the Ψ(x) profile has to be calculated.

Note that the Ψ(x) profile, where x is the co-ordinate perpendicular to the channel (see FIG. 3), x=0 being at the gate-oxide semiconductor interface, can be obtained from Poisson's equation: which is given as Eqn.(4) in FIG. 13, where $f$ is the Fermi function and N(E) has been discretised into j blocks.

Eqn.(4) can be solved by relaxation, given the boundary conditions Ψ(0)=Ψs and where dΨ/dx$|_{x=d}$=0, where d is the active layer thickness.

The Ψ(x) profile is made accurate by comparing the experimental G with the calculated G, which is simply a function of Ψ(x), the active layer thickness d, and the electron and hole conductances at flat band, $G_{n0}$ and $G_{p0}$. This is stated explicitly as shown in Eqn.(5) of FIG. 13.

The set of equations, Eqns. (3) to (5), are solved by iteration. In order to initialise the process, Eqn (6) can be used. It should be noted that Eqn (6) is simply one example of an equation suitable for specifying the function of surface potential (Ψs), density of states DOS at flat band ($N_E$), distance into the active layer thickness (x) and active layer thickness d. The person skilled in the art could readily derive other suitable equations. In Eqn.(6) Ψs is small.

Using a least squares method, Eqn.(6) together with Eqn.(5), and the corresponding conductance G from the G-V data at the flat band voltage $V_{FB}$, gives $G_{n0}$, $G_{p0}$, $E_F$ and $N_E$. The latter two values are used in Eqn.(4) to start the iteration.

The processing depicted in FIG. 4 illustrate a method of determining the bulk states and interface states of a polysilicon thin film transistor from a current-voltage measurement and a capacitance-voltage measurement, the current-voltage measurement being source/drain current ($I_{DS}$) measurements relative to gate/source voltage ($V_{GS}$): comprising the steps of:

a determining the minima of the capacitance-voltage measurement and assigning this value as the flat band voltage ($V_{FB}$)

b using the flat band voltage ($V_{FB}$) and the capacitance-voltage measurement to calculate the relationship between the gate surface potential ($\psi_s$) and gate/source voltage ($V_{GS}$), using the relationship that the charge on the gate ($Q_G$) is equal to the integral of the product of the oxide capacitance per unit area ($C_{ox}$) and the voltage drop across the oxide ($V_{ox}$) and the relationship that the derivative of the gate surface potential ($\psi_s$) with respect to the gate/source voltage ($V_{GS}$) is a function of the gate width (W), channel length (L), the capacitance (C) measured between the gate and the drain/source contacts electrically connected together;

c using the calculated relationship between the gate surface potential ($\psi_s$) and gate/source voltage ($V_{GS}$), the relationship that the charge on the gate ($Q_G$) is equal to the integral of the product of the oxide capacitance per unit area ($C_{ox}$) and the voltage drop across the oxide ($V_{ox}$), the relationship that the charge on the gate ($Q_G$) is the sum of the surface charge ($Q_{ss}$) and the bulk charge ($Q_B$) where the the bulk charge ($Q_B$) is the product of the dielectric permittivity of silicon ($\epsilon_S$) and the surface field ($F_S$), which is the derivative of the calculated profile of the surface potential ($\psi_x$); to calculate and output the interface states information;

d dividing the source/drain current ($I_{DS}$) with the drain/source voltage ($V_{DS}$) to obtain conductance/gate voltage data (G-$V_{GS}$);

e using the conductance/gate voltage data (G-$V_{GS}$) and the flat band voltage ($V_{FB}$) to provide inputs to an initialisation process and to an iteration process, the initialisation process also receiving as an input the calculated relationship between the gate surface potential ($\psi_s$) and gate/source voltage ($V_{GS}$);

f the initialisation process comprising the steps of:
1 calculating the conductance (G{$V_{FB}$}) at the flat band voltage ($V_{FB}$) from the conductance/gate voltage data (G-$V_{GS}$);
2 initialising a calculation of the profile of the surface potential ($\psi_x$) using Poisson's equation, in which the Fermi function (f) is used and in which the density of states ($N_E$) is separated into a plurality of discrete blocks, using the calculated conductance (G{$V_{FB}$}) at the flat band voltage ($V_{FB}$) and using the calculated relationship between the gate surface potential ($\psi_s$) and gate/source voltage ($V_{GS}$) in a function for the profile of the surface potential ($\psi_x$) based on the variables of the gate surface potential ($\psi_s$), the density of states ($N_E$), and the active layer thickness (d);
3 applying a least squares method to the initialises calculation of the profile of the surface potential ($\psi_x$) so as to calculate intialised values for :the electron conductance ($G_{n0}$) at the flat band voltage, the hole conductance ($G_{p0}$) at the flat band voltage, the density of states ($N_E$), and the Fermi energy ($E_F$);

g the iteration process comprising the steps of:
1 using the calculated conductance/gate voltage data (G-$V_{GS}$) and the initalised values of the electron conductance ($G_{n0}$) at the flat band voltage and the hole conductance ($G_{p0}$) at the flat band voltage in making a comparison of experimental conductance with conductance calculated as the sum of a function of the electron conductance ($G_{n0}$) at the flat band voltage and a function of the hole conductance ($G_{p0}$) at the flat band voltage;
2 using the result of the comparision to calculate the electron conductance ($G_{n0}$), the hole conductance ($G_{p0}$), the density of states at the flat band voltage ($N_E$), and Fermi energy ($E_F$);
3 using the result of the comparision to adjust the profile of the surface potential ($\psi_x$);
4 using the adjusted profile of the surface potential ($\psi_x$) and the initialised values of the density of states at the flat band voltage ($N_E$), and Fermi energy ($E_F$) to calculate the profile of the surface potential ($\psi_x$) using Poisson's equation, in which the Fermi function (f) is used and in which the density of states ($N_E$) is separated into a plurality of discrete blocks;
5 adopting a relaxation by applying the boundary conditions $\psi(0)=\psi_s$ and $d\psi/dx|_{x=d}=0$, where d is the active layer thickness to calculate a value for the profile of the surface potential ($\psi_x$);
6 repeating steps 1 to 5 inclusive of the iteration process a plurality of times;

h whereby the result of the iteration process is an output of the bulk states information.

Figure 5:
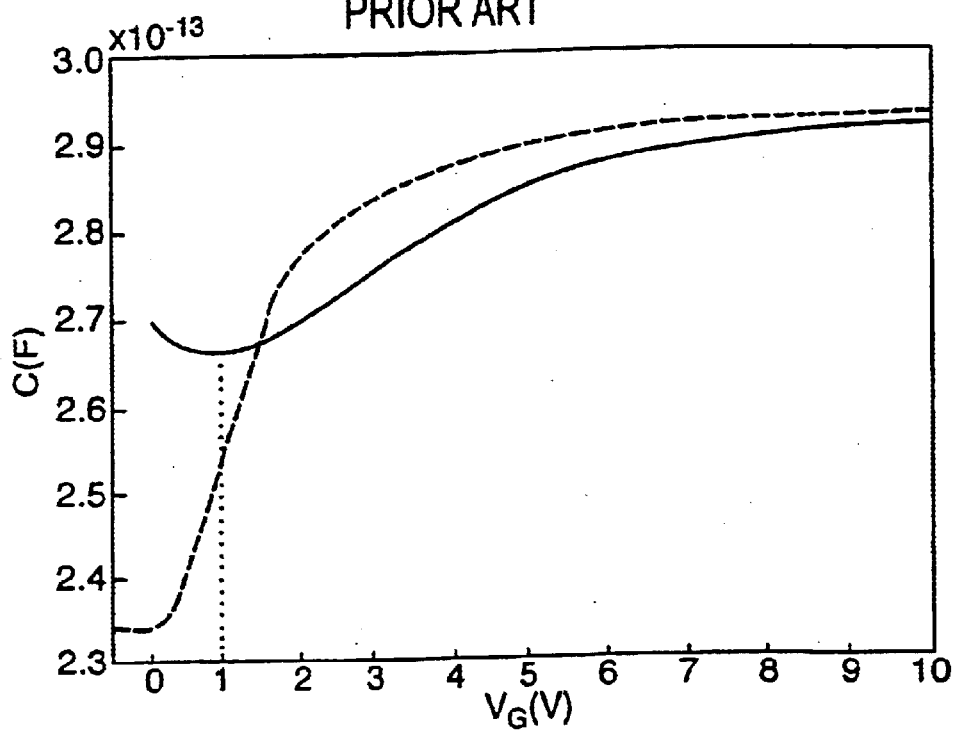
FIG. 5 is a graph showing two simulated C-V curves.

FIG. 5 is a graph showing simulated C-V curves with (solid) and without (dashed) interface states. The minima occur at 0.9V and 0V respectively and correspond to the flat band voltages.

Figure 6:
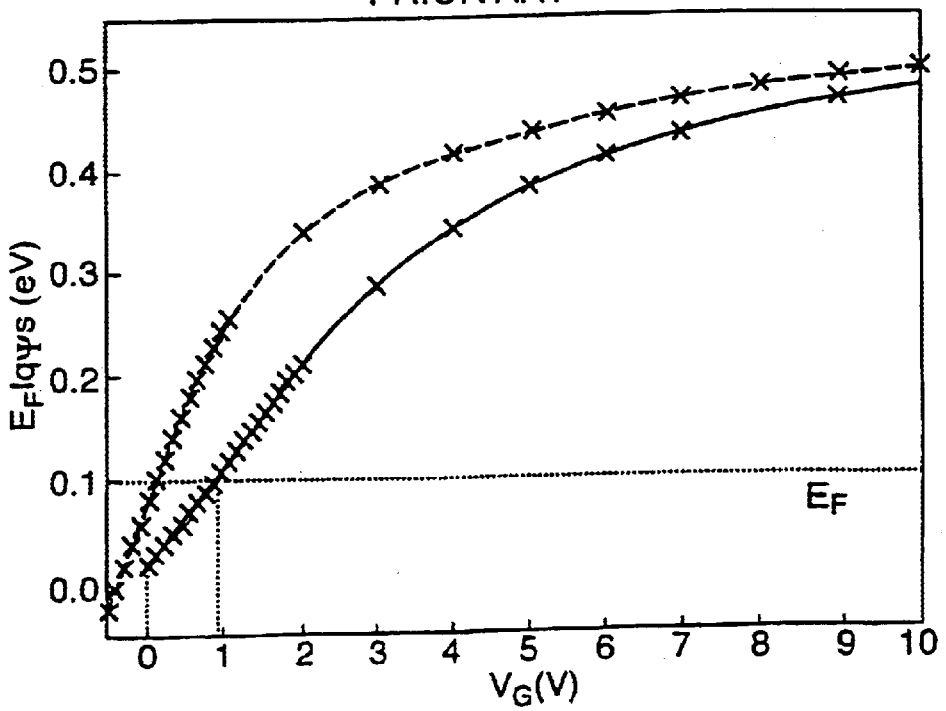
FIG. 6 is a graph showing a comparision between two V-ψ data sets.

FIG. 6 shows comparison of $V_{GS}$-$\Psi S$ data (solid line—with interface states, dashed line-without) derived from the C-V data of FIG. 5. The direct $V_{GS}$-$\Psi S$ data are extracted from simulations (crosses). The Fermi energy $E_F$ occurs at 0.10 eV as indicated by the dotted line. The flat band voltages used in extracting $V_{GS}$-$\Psi S$ are those of FIG. 5.

Figure 7:
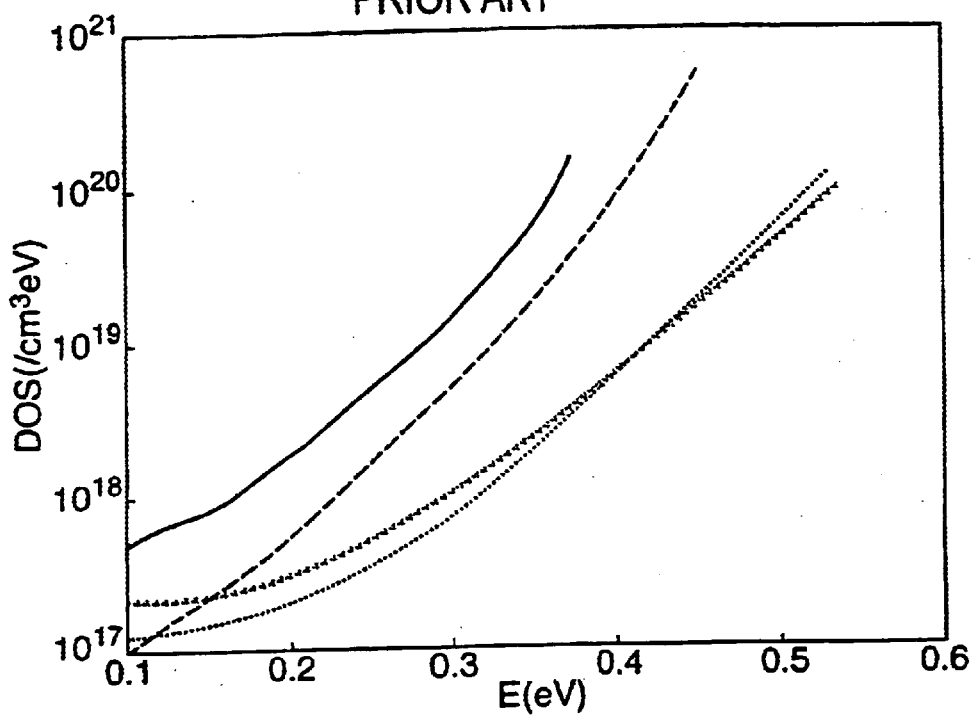
FIG. 7 is a graph showing bulk DOS obtained by different methods.

FIG. 7 shows bulk DOS obtained with the field effect conductance method with (solid) and without (dashed) interface states as compared to that obtained by the new method (dots). The actual DOS is represented by crosses. The conduction band $E_c$ is at 0.56 eV.

Figure 8:
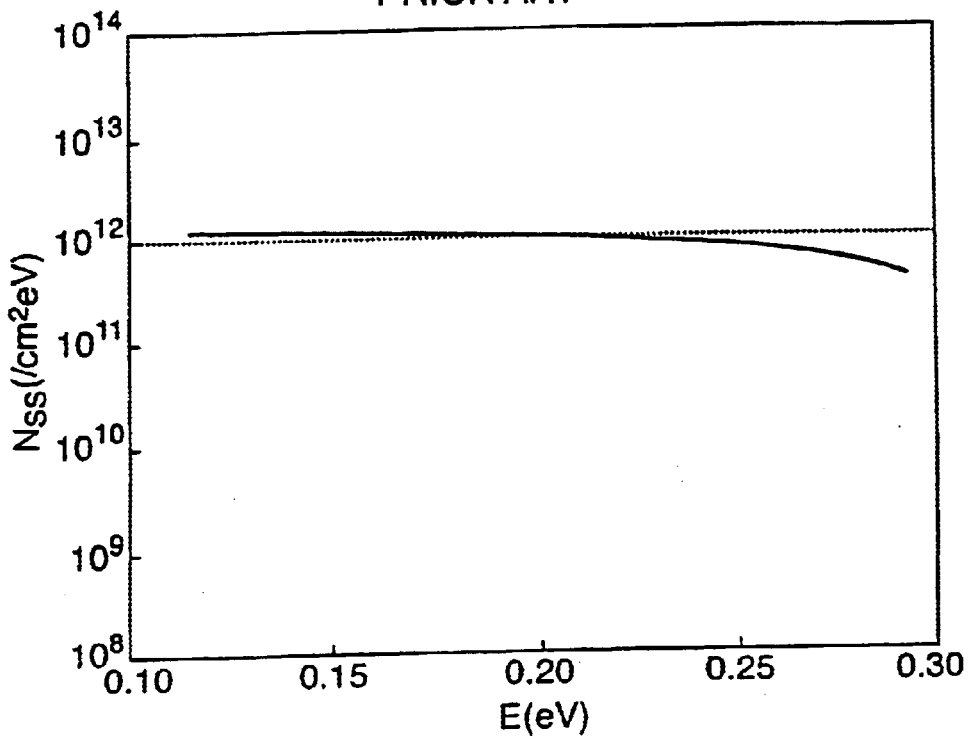
FIG. 8 is a graph showing a comparision between various interface states.

FIG. 8 shows comparison between extracted interface states (solid) and input interface states (dots). The conduction band $E_c$ is at 0.56 eV.

Figure 9:
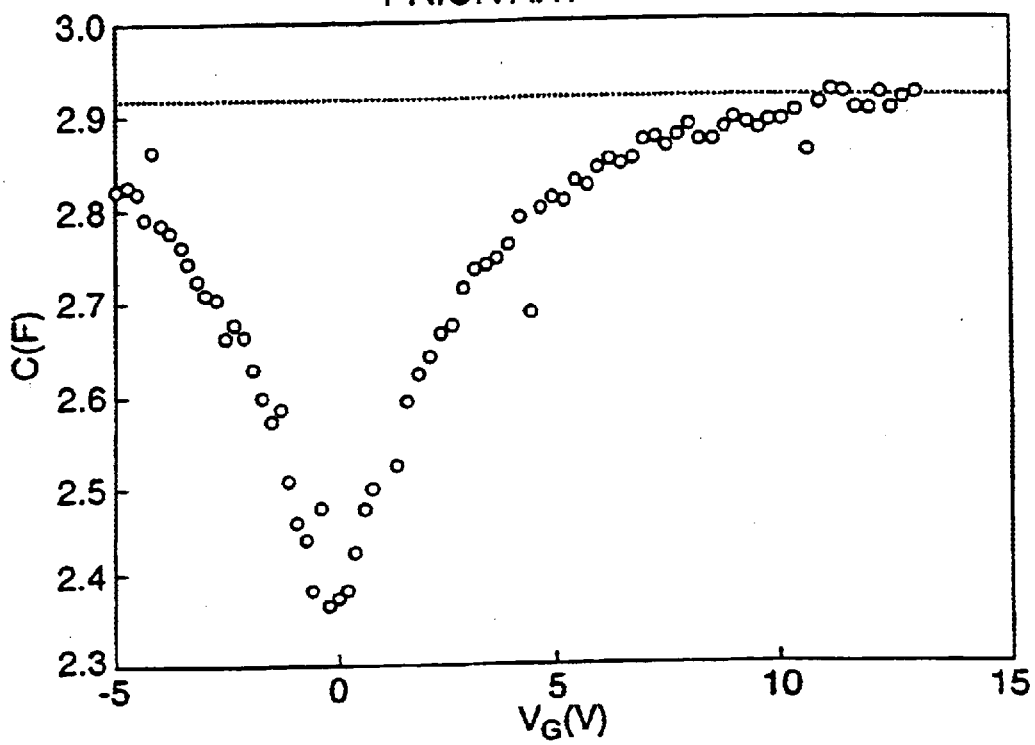
FIG. 9 is a graph showing an experimental C-V curve.

FIG. 9 shows experimental C-V curve for an n-type device $C_{ox}$ is represented by the dotted line.

Figure 10:
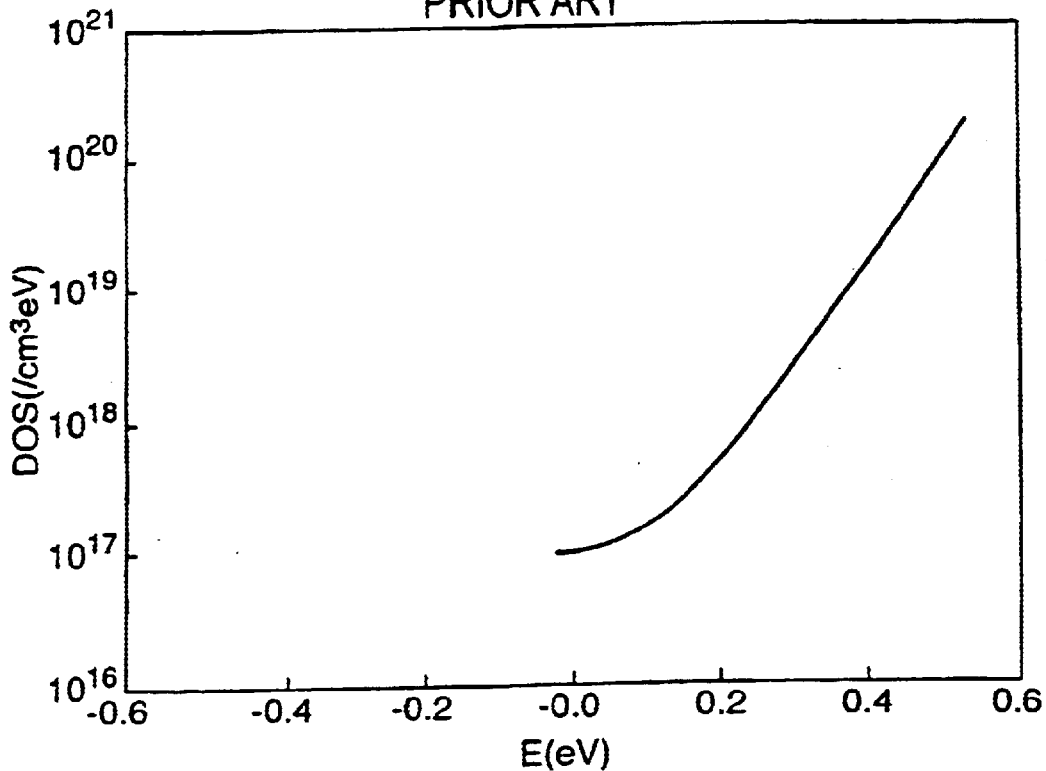
FIG. 10 is a graph showing extracted bulk DOS.

FIG. 10 shows extracted bulk DOS for an n-type device.

Figure 11:
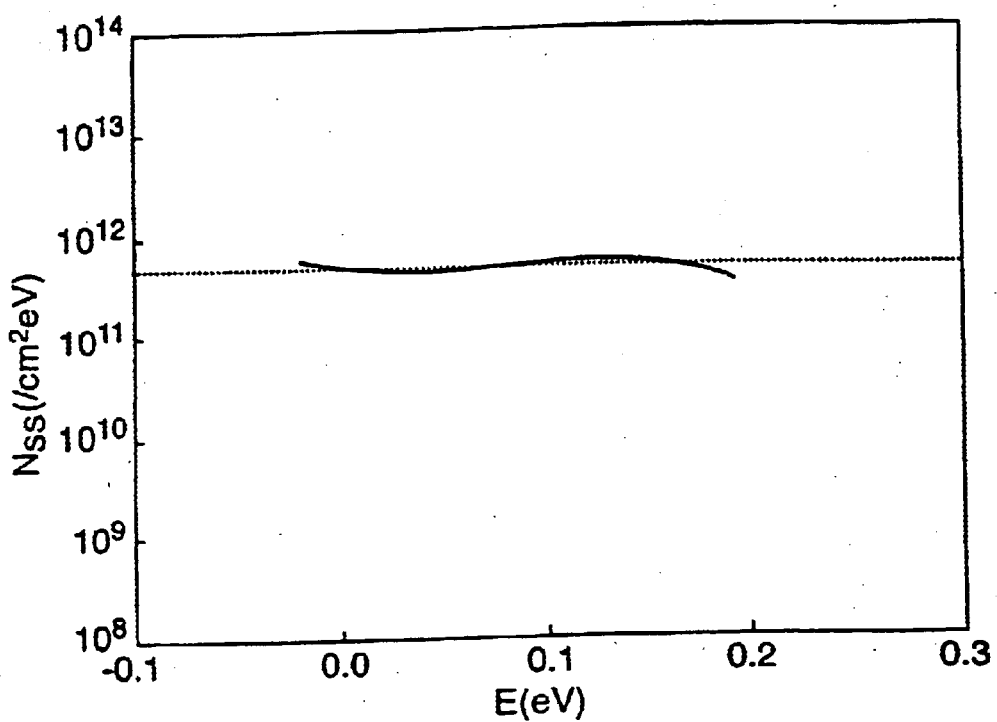
FIG. 11 is a graph showing input and extracted interface states.

FIG. 11 shows extracted interface states (solid) for an n-type device. Input interface states for simulation is represented by the dotted line.

Figure 12:
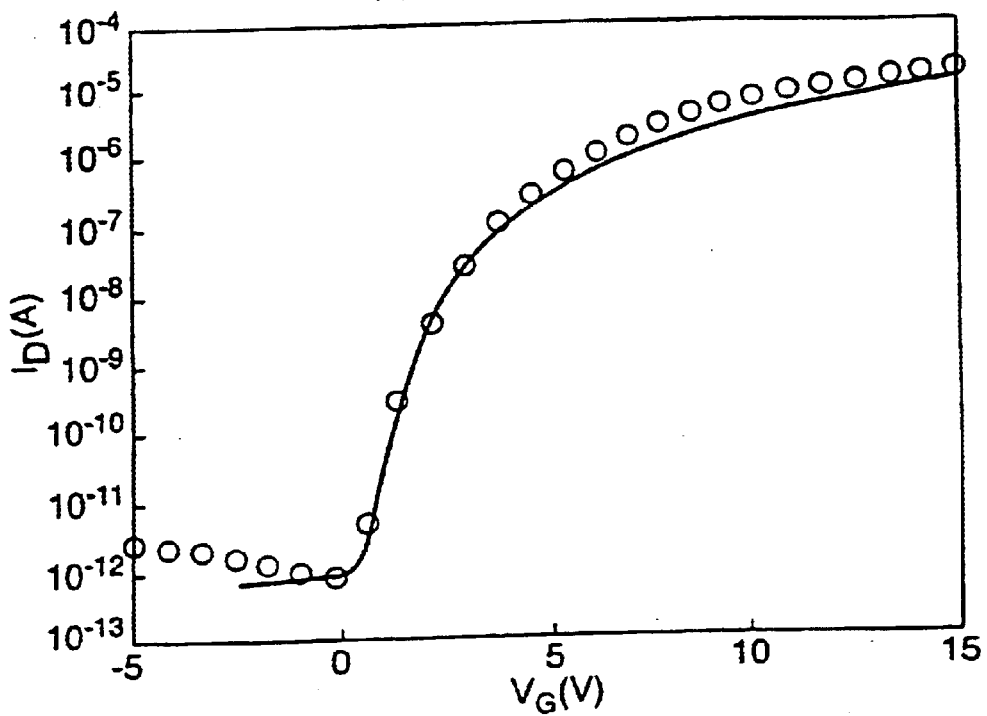
FIG. 12 is a graph showing a comparision between two I-V curves.

FIG. 12 shows comparison between experimental (circles) and simulated (solid) I-V curves for an n-type device.

The advantages of the present invention include:
1. Only two simple I-V and C-V measurements at room temperature are required (no use of cryostat, non-destructive testing of sample)
2. Determination of the flat band voltage,
3. Determination of the electron and hole flat band conductances, and hence the bulk Fermi energy,
4. Greater immunity to noise from the original data (no direct relationship with second order derivatives involved).
5. No 0° Kelvin approximation.
6. Applicability to thin active layers (no assumption of semi-infinite thickness of sample).
7. Very high level of accuracy achieved in the DOS determination.
8. The method yields the interface state density.
9. The parameter extraction is very fast.

What is claimed is:

1. An automated method a method of determining the bulk states and interface states of a polysilicon thin film transistor from a current-voltage measurement and a capacitance-voltage measurement, the current-voltage measurement being source/drain current measurements relative to gate/source voltage: comprising the steps of:

a determining the minima of the capacitance-voltage measurement and assigning this value as the flat band voltage;

b using the flat band voltage and the capacitance-voltage measurement to calculate the relationship between the gate surface potential and gate/source voltage, using the relationship that the charge on the gate is equal to the integral of the product of the oxide capacitance per unit area and the voltage drop across the oxide and the relationship that the derivative of the gate surface potential with respect to the gate/source voltage is a function of the gate width, channel length, the capacitance measured between the gate and the drain/source contacts electrically connected together;

c using the calculated relationship between the gate surface potential and gate/source voltage, the relationship that the charge on the gate is equal to the integral of the product of the oxide capacitance per unit area and the voltage drop across the oxide, the relationship that the charge on the gate is the sum of the surface charge and the bulk charge where the bulk charge is the product of the dielectric permittivity of silicon and the surface field, which is the derivative of the calculated profile of the surface potential; to calculate and output the interface states information;

d dividing the source/drain current with the drain/source voltage to obtain conductance/gate voltage data; and e using the conductance/gate voltage data and the flat band voltage to provide inputs to an initialisation process and to an iteration process, the initialisation process also receiving as an input the calculated relationship between the gate surface potential and gate/source voltage;

f the initialisation process comprising the steps of:
      1 calculating the conductance at the flat band voltage from the conductance/gate voltage data;
      2 initialising a calculation of the profile of the surface potential using Poisson's equation, in which the Fermi function is used and in which the density of states is separated into a plurality of discrete blocks, using the calculated conductance at the flat band voltage and using the calculated relationship between the gate surface potential and gate/source voltage in a function for the profile of the surface potential based on the variables of the gate surface potential, the density of states, and the active layer thickness; and
      3 applying a least squares method to the initialises calculation of the profile of the surface potential so as to calculate intialised values for :the electron conductance at the flat band voltage, the hole conductance at the flat band voltage, the density of states, and the Fermi energy;

g the iteration process comprising the steps of:
      1 using the calculated conductance/gate voltage data and the initalised values of the electron conductance at the flat band voltage and the hole conductance at the flat band voltage in making a comparison of experimental conductance with conductance calculated as the sum of a function of the electron conductance at the flat band voltage and a function of the hole conductance at the flat band voltage;
      2 using the result of the comparison to calculate the electron conductance, the hole conductance, the density of states at the flat band voltage, and Fermi energy;
      3 using the result of the comparison to adjust the profile of the surface potential;
      4 using the adjusted profile of the surface potential and the initialised values of the density of states at the flat band voltage, and Fermi energy to calculate the profile of the surface potential using Poisson's equation, in which the Fermi function is used and in which the density of states is separated into a plurality of discrete blocks;
      5 adopting a relaxation by applying the boundary conditions $\psi(0)=\psi_s$ and $d\psi/dx|_{x=d}=0$, where d is the active layer thickness to calculate a value for the profile of the surface potential $\psi_x$; and
      6 repeating steps 1 to 5 inclusive of the iteration process a plurality of times;

h whereby the result of the iteration process is an output of the bulk states information.

2. A device for modelling electrical characteristics of a thin film transistor comprising:

means for receiving the result of a current-voltage measurement and a capacitance-voltage measurement both measurements having been performed on the thin film transistor;

means which calculate the flat band voltage from the input capacitance-voltage measurement;

means having stored therein a general expression of Gauss's Law;

means having stored therein a capacitance voltage relationship which defines capacitance;

means which apply the general expression of Gauss's Law and the calculated flat band voltage to the capacitance voltage relationship which defines capacitance so as to calculate a relationship between gate surface potential and gate/source voltage;

means which apply Gauss's Law to the calculated relationship between gate surface potential and gate/source voltage to thereby calculate and output interface states information for the thin film transistor;

means which calculate conductance/gate voltage data from the current-voltage measurement using the calculated flat band voltage;

means having stored therein a conductance equation;

initialisation means which conduct an initialisation process using the calculated conductance/gate voltage data and the calculated relationship between gate surface potential and gate/source voltage, and which uses the conductance equation so as to calculate initalised values for the electron conductance at the flat band voltage, for the hole conductance at the flat band voltage, for a density of states function and for the Fermi Energy;

means having stored therein Poisson's equation; and iteration means which conduct an iteration process based on Poisson's equation using the said initalised values calculated by the initialisation means and the calculated conductance/gate voltage data to thereby calculate and output bulk states information for the thin film transistor;

wherein the initialisation means comprises:
      means which calculate the conductance at the flat band voltage from the conductance/gate voltage data;
      means having stored therein an expression of Poisson's equation, which expression uses the Fermi function and in which the density of states is separated into a plurality of discrete blocks;
      means having stored therein a function for the profile of the surface potential based on the variables of the gate surface potential, the density of states, the distance into the active layer and the active layer thickness;
      means which initialise a calculation of the profile of the surface potential, said calculation using the said expression of Poisson's equation, using the calculated conductance at the flat band voltage and using the calculated relationship between the gate surface potential and gate/source voltage in the said function for the profile of the surface potential; and
      means which apply a least squares method to the initialised calculation of the profile of the surface potential so as to calculate intialised values for the electron conductance at the flat band voltage, the hole conductance at the flat band voltage, the density of states, and the Fermi energy; and wherein the iteration means comprises:
      means which use the calculated conductance/gate voltage data and the initalised values of the electron conductance at the flat band voltage and the hole conductance at the flat band voltage in making a comparison of experimental conductance with conductance calculated as the sum of a function of the electron conductance at the flat band voltage and a function of the hole conductance at the flat band voltage;
      means which use the result of the comparison to calculate the electron conductance, the hole conductance, the density of states at the flat band voltage, and Fermi energy;
      means which use the result of the comparison to adjust the profile of the surface potential;
      means which use the adjusted profile of the surface potential and the initialised values of the density of states at the flat band voltage, and Fermi energy to calculate the profile of the surface potential using Poisson's equation, in which the Fermi function is used and in which the density of states is separated into a plurality of discrete blocks;
      means which adopt a relaxation by applying boundary conditions for the surface potential and the first derivative thereof to calculate a value for the profile of the surface potential; and
      means which apply the calculated value for the profile of the surface potential to the said comparison of conductances so as to repeat the iteration process.

* * * * *